United States Patent [19]
Son

[11] Patent Number: 6,026,045
[45] Date of Patent: Feb. 15, 2000

[54] SEMICONDUCTOR MEMORY DEVICE HAVING MULTIBANK

[75] Inventor: Moon-hae Son, Seoul, Rep. of Korea

[73] Assignee: Samsung Electronics, Co., Ltd., Suwon, Rep. of Korea

[21] Appl. No.: 09/035,678

[22] Filed: Mar. 5, 1998

[30] Foreign Application Priority Data

Mar. 8, 1997 [KR] Rep. of Korea .......................... 97-7818

[51] Int. Cl.⁷ .................................................. G11C 8/00
[52] U.S. Cl. .............................. 365/230.03; 365/230.06; 365/230.08
[58] Field of Search .......................... 365/230.03, 230.06, 365/194, 230.05, 189.03, 230.08

[56] References Cited

U.S. PATENT DOCUMENTS

| | | | |
|---|---|---|---|
| 5,261,068 | 11/1993 | Gaskins et al. .......................... | 395/425 |
| 5,715,209 | 2/1998 | Yoo ...................................... | 365/230.03 |
| 5,774,409 | 6/1998 | Yamazaki et al. .................. | 365/230.03 |

FOREIGN PATENT DOCUMENTS

| | | |
|---|---|---|
| 9426065 | 6/1995 | United Kingdom . |
| 9609788 | 11/1996 | United Kingdom . |
| 9701728 | 9/1997 | United Kingdom . |

Primary Examiner—David Nelms
Assistant Examiner—David Lam
Attorney, Agent, or Firm—Marger Johnson & McCollom, P.C.

[57] ABSTRACT

There is provided a semiconductor memory device having a multibank in which a single large memory cell is divided into a plurality of banks without increasing power consumption and chip size. In the semiconductor memory device, a memory cell array is divided into a plurality of banks arranged alternately, and each bank includes a plurality of unit memory cell arrays. In addition, column selection lines of each bank are connected to alternate output ports of a column decoder, and the column decoder enables the column selection lines of a bank selected from the plurality of banks in response to address decoding signals and bank selection signals.

6 Claims, 10 Drawing Sheets

SEMICONDUCTOR MEMORY DEVICE HAVING MULTIBANK

BACKGROUND OF THE INVENTION

1. Field of the Invention

The present invention relates to a semiconductor memory device, and more particularly, to a semiconductor memory device having a multibank, that is, a plurality of banks divided from a single large memory cell array.

2. Description of the Related Art

As the power of microprocessors continues to increase, the access time to memory must continue to decrease so that the utility of these powerful microprocessors is realized. Additionally, since more data needs to be available to the newer powerful microprocessors, the size of memory storage units will detrimentally increase if steps are not taken to reduce their size requirements as well as access speed. Furthermore, the reduction of power consumption by a memory device is an on-going challenge in the development of new memory devices.

More particularly, in a system using general semiconductor memory device hierarchy, the bandwidth of the semiconductor memory devices, especially DRAMs, is small. Therefore, bank interleaving is generally used to transmit a large amount of data within a predetermined time. In bank interleaving, several memory devices are each divided into a plurality of banks and a memory controller successively obtains data from each bank. That is, interleaving provides the simultaneous accessing of two or more bytes or streams of data from distinct storage units. Disk drives for example, normally interleave sectors on the storage media so that they can read successive sectors in one pass of the read/write heads. Without this, i.e. if the sectors were arranged in sequence physically, the drive might not have enough time to read successive sectors and consequently access time would be longer. Recently, the interleaving function has been performed with a single semiconductor memory device by providing a plurality of banks to the semiconductor device.

FIG. 1 is a schematic block diagram of a conventional semiconductor memory device having a multibank including a plurality of cell arrays all part of a single bank. Here, a single bank A and portions related to column decoding are shown.

Referring to FIG. 1, in the conventional semiconductor memory device having a multibank, a bank, for example, bank A includes a single independent large memory cell array 1, a column decoder 5, and a row decoder 7. The large memory cell array 1 includes a plurality of unit memory cell arrays 2, and is shown to have sixteen unit memory cell arrays 2 in FIG. 1. The output ports of the column decoder 5 are connected to a plurality of column selection lines CLS0(A)~CSLn(A) all of which are part of a single bank A. The output ports of the column decoder 5 are further connected to a plurality of column selection lines CLS0(A)–CLSn(A). The single bank column decoder 5 enables column selection lines CLS0(A)~CLSn(A) in pairs, in response to a plurality of first predecoding signals PDCA23, PDCA45, and PDCA67, a second predecoding signal DCA01, and a reset pulse CSLRSP. That is, the column selection lines CSL0(A)~CSLn(A) are enabled in pairs by the same column address, and select a column corresponding to the single bank A. In addition, each of the column selection lines CSL0(A)~CSLn(A) are connected to four switching transistors 3 at both sides of the unit memory cell arrays 2. The connection between the column selection lines and the switching transistors will be described in detail referring to FIG. 2.

In addition, the conventional semiconductor memory device having a single multibank includes first and second column predecoders 13 and 15, a bank selection bit buffer 17, a column address buffer 19, first and second delays 21 and 23, and a clock buffer 25. The column address buffer 19 buffers externally input column address bits A0~A7, and the bank selection bit buffer 17 buffers externally input bank selection bits BS0 and BS1. The first column predecoder 13 decodes outputs PBS0 and PBS1 of the bank selection bit buffer 17 and CA2~CA7 which are some of the outputs of the column address buffer 19, and generates the plurality of first predecoding signals PDCA23, PDCA45, and PDCA67. The second column predecoder 15 decodes CA0 and CA1 which are others of the outputs of the column address buffer 19, in response to an internal delayed clock signal PCLKD, and generates the second predecoding signal DCA01. The clock buffer 25 buffers an externally input clock signal CLK and outputs an internal clock signal PCLK. The first and second delays 21 and 23 delay the internal clock signal PCLK, respectively, and generate the delayed clock signal PCLKD and the reset pulse CSLRSP.

FIG. 2 is a circuit diagram showing the connections between the column selection lines and the switching transistors in the conventional semiconductor memory device having a single multibank.

Referring to FIG. 2, one of the two same column selection lines CLSi(A) enabled by the same column address is connected to each gate of four switching transistors S1, S2, S3, and S4 which connect four of input and output lines I/O to two pairs of bit lines and complementary bit lines BLi, BLi, BLi+1, and BLi+1 in the conventional semiconductor memory device having a multibank. The other column selection line is connected to each gate of four switching transistors S5, S6, S7, and S8 which connect the other four of input and output lines I/O to two pairs of bit lines and complementary bit lines BLi+2, BLi+2, BLi+3, and BLi+3. Sense amplifiers SA1, SA2, SA3, and SA4 are connected between the bit lines and the complementary bit lines which are given in pairs.

Isolation gates $T_{i1}$–$T_{i8}$ are connected respectively between the bit lines and complementary bit lines of unit memory cell arrays at the left side, including memory cells ML, and the sense amplifiers SA1, SA2, SA3, and SA4. Isolation gates $T_{j1}$–$T_{j8}$ are connected between the bit lines and complementary bit lines of unit memory cell arrays at the right side, including memory cells MR, and the sense amplifiers SA1, SA2, SA3, and SA4.

In the conventional semiconductor memory device having a multibank as described above, when the single large memory cell array 1 is divided into a plurality of banks, for example, two banks, (i.e. banks A and B), it is necessary to use the column selection lines CSL0(A)~SLn(A) together in both banks. Thus, when the rows of both banks are activated by the row decoder 7 and data of a memory cell is read by selecting the column of either bank, the same column selection line is used in the other non-selected bank, in the conventional semiconductor memory device. Therefore, current flows from a power voltage VCC to a ground voltage VSS through load transistors of the input and output lines I/O, the switching transistors connecting the input and output lines I/O to the bit lines and complementary bit lines, and the N-type sense amplifiers. Accordingly, in the case that the large memory cell array 1 is divided into two banks in the conventional semiconductor memory device having a multibank, power consumption detrimentally increases when the data of a memory cell is read. Therefore, when a large memory cell array is divided into a plurality of banks, each bank should have its own column decoder to prevent such increased power consumption. However, with this solution, chip size detrimentally increases.

SUMMARY OF THE INVENTION

The object of the present invention is to provide a semiconductor memory device having a multibank, in which a single large memory cell array is divided into a plurality of banks, without increasing power consumption or the chip size.

To achieve the above object, the semiconductor memory device comprises a memory cell array divided into a plurality of banks, each bank, for example, being alternately arranged with the other banks, and including a plurality of unit memory cell arrays, and a single column decoder having output ports alternately connected to the column selection lines of each bank, for enabling the column selection lines of a bank selected from the plurality of banks in response to address decoding signals and bank selection signals.

The semiconductor memory device having a multibank further comprises a column address buffer, a bank selection bit buffer, a first column predecoder, a second column predecoder, a clock buffer, and first and second delays. The column address buffer buffers an externally input column address. The bank selection bit buffer buffers externally input bank selection bits. The first column predecoder decodes some of output signals of the column address buffer and generates the address decoding signals. The second column predecoder decodes the remaining output signals of the column address buffer in response to the output signals of the bank selection bit buffer and a delayed internal clock signal and generates the bank selection signals. The clock buffer buffers an externally input clock signal and generates an internal clock signal. The first and second delays delay the internal clock signal and generate the delayed clock signal and reset pulse, respectively.

In addition, the column selection lines of each of the banks are connected to switching transistors which connect input and output lines to bit lines of the bank. The column decoder comprises a plurality of bank column decoders for enabling the column selection lines of each bank, and each bank column decoder enables the column selection lines of the bank in response to the address decoding signals and one of the bank selection signals.

Therefore, the semiconductor memory device having a multibank according to the present invention is so constituted that the column decoder for each bank is alternately arranged in a single column decoder without adding a column decoder area to each bank in order to alternately output the column selection lines of the bank. Thus, a single large memory cell array can be divided into a plurality of banks without increasing chip size or power consumption.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 3:
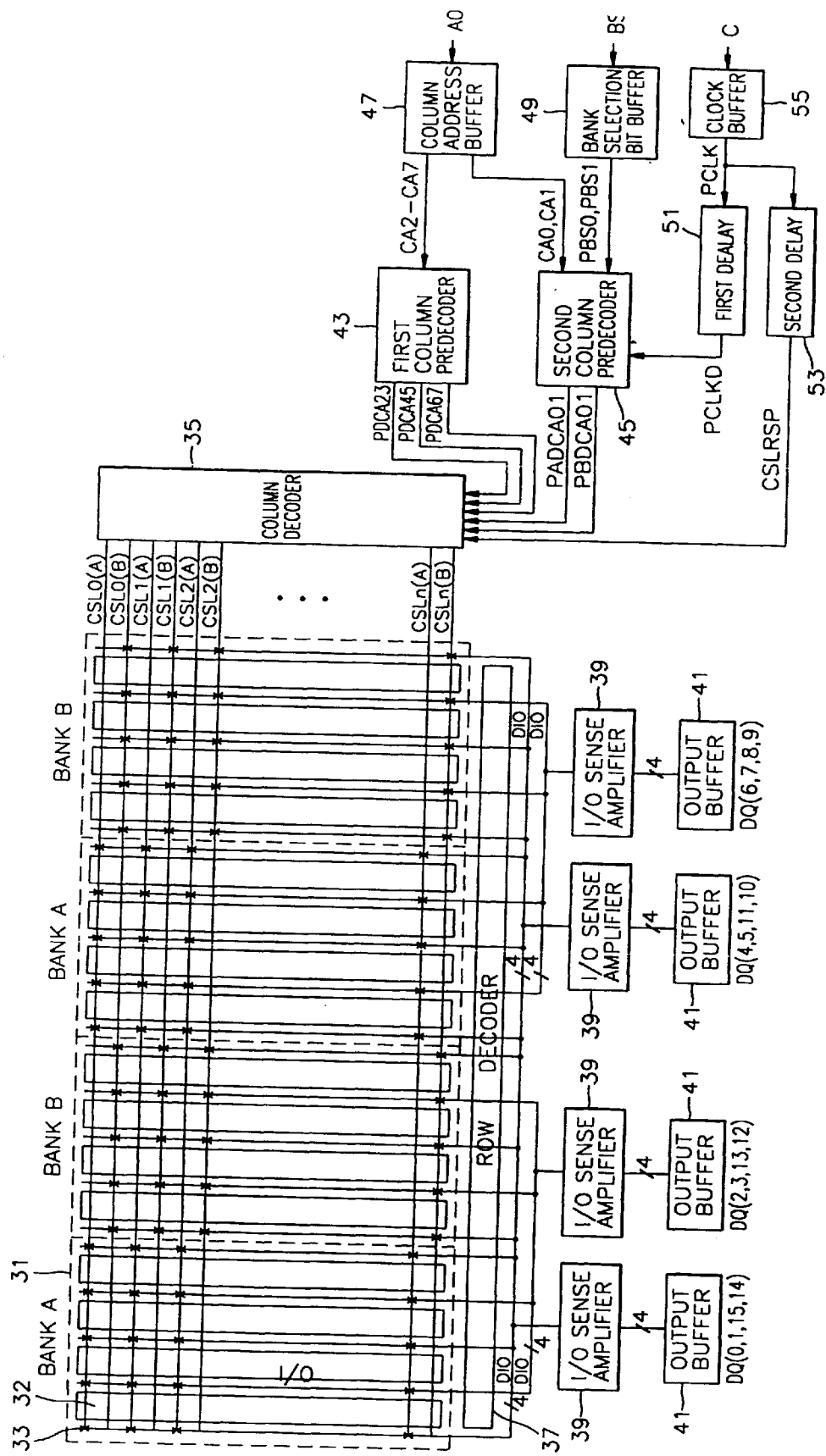
FIG. 3 is a schematic block diagram of a semiconductor memory device having a multibank according to an embodiment of the present invention.

FIG. 3 is a schematic block diagram of a semiconductor memory device having a multibank according to an embodiment of the present invention. Here, a single large memory cell array divided into a plurality of banks A and B and portions related to a single column decoder are shown.

Referring to FIG. 3, the semiconductor memory device having a multibank according to the embodiment of the present invention includes a single large memory cell array 31, a column decoder 35, and a row decoder 37. The large memory cell array 31 includes a plurality of unit memory cell arrays 32, and is shown to include sixteen unit memory cell arrays 32 in FIG. 3. In addition, each bank is alternately arranged with the other banks and includes groups of four unit memory cell arrays.

Figure 1:
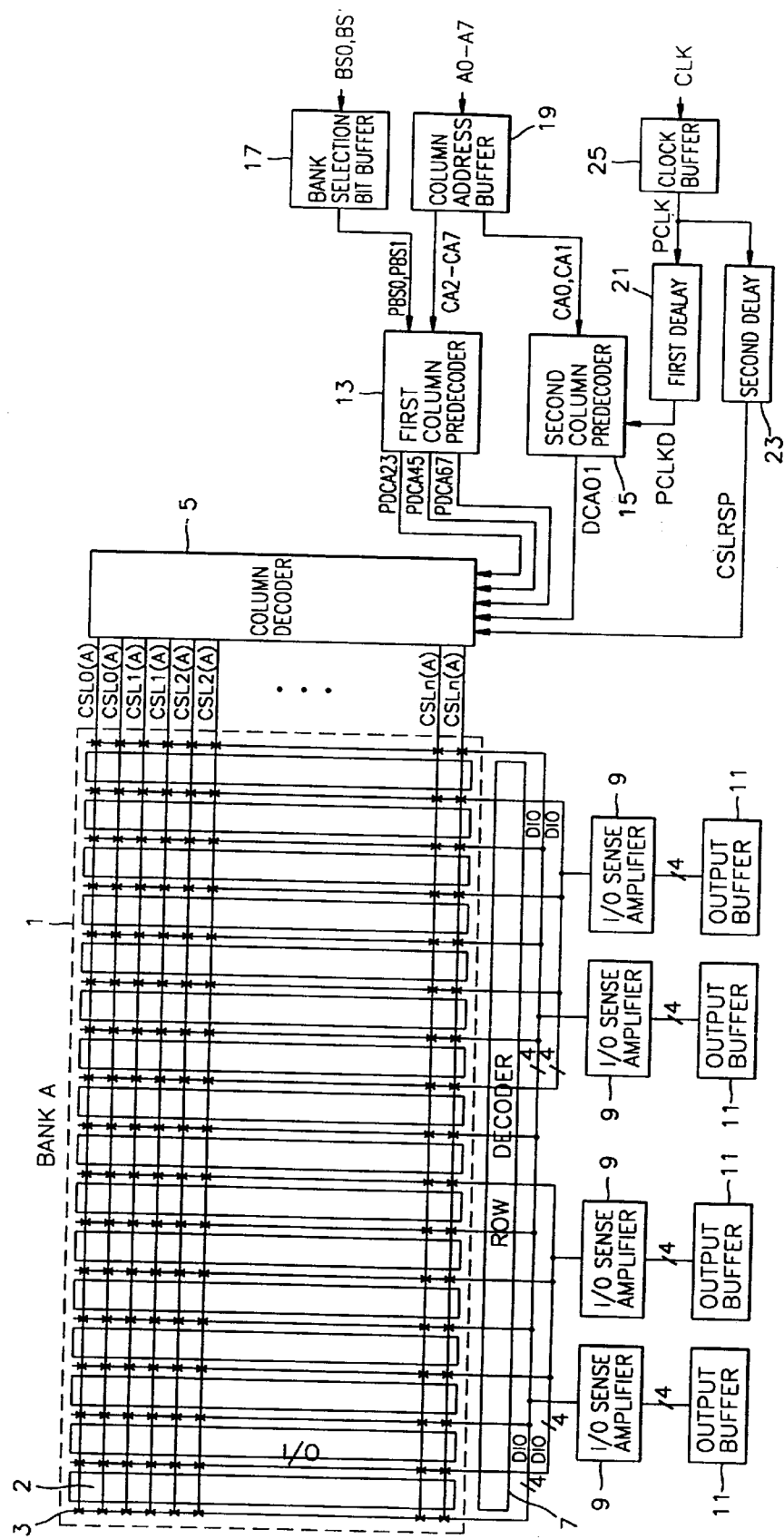
FIG. 1 is a schematic block diagram of a conventional semiconductor memory device having a multibank.
Figure 2:
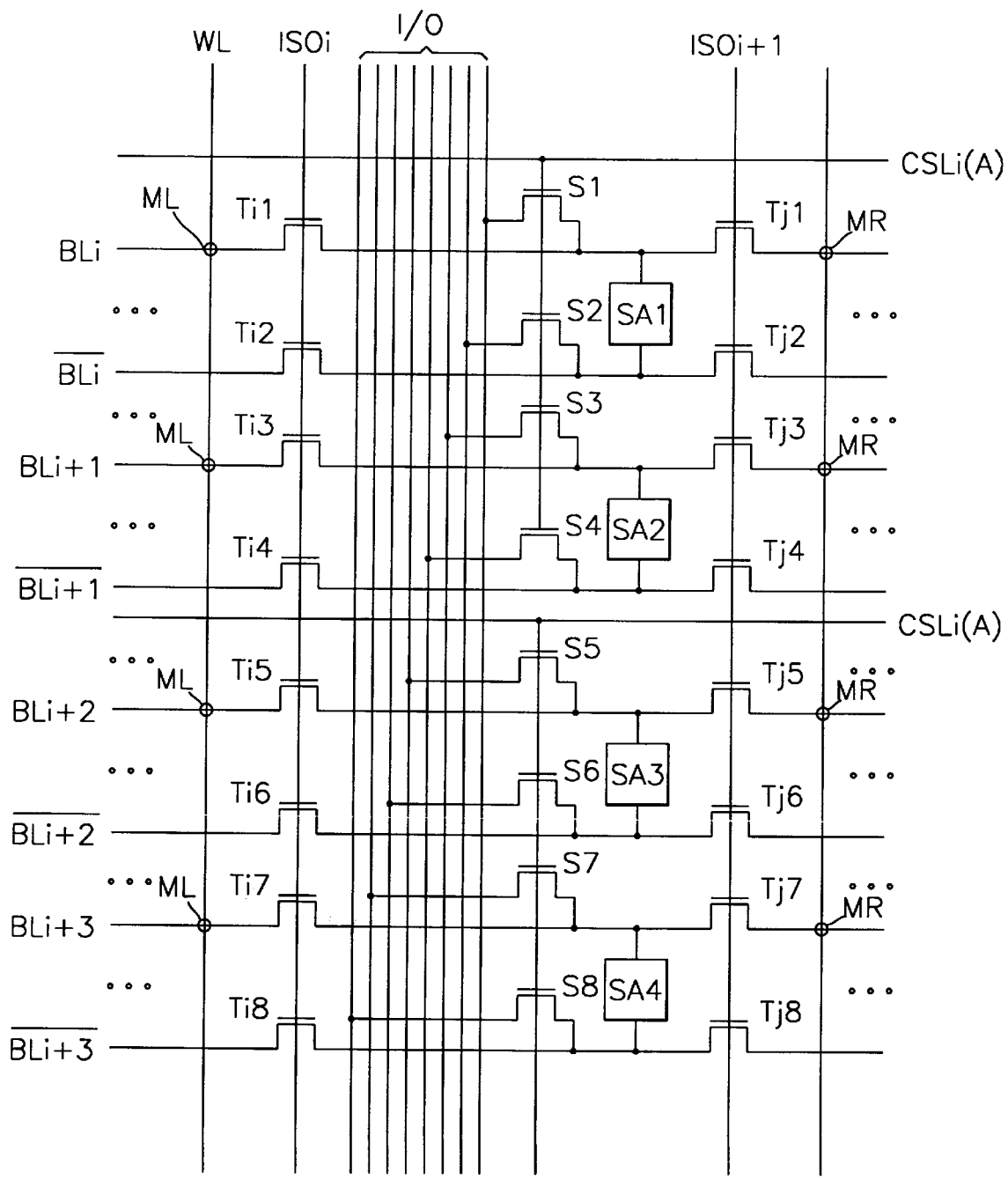
FIG. 2 is a circuit diagram showing the connections between the column selection lines and the switching transistors in the conventional semiconductor memory device having the multibank shown in FIG. 1.

The column decoder 35 has output ports connected alternately to column selection lines CSL0(A), CSL1(A), . . . , CSLn(A) of bank A and column selection lines CSL0(B), CSL1(B), . . . , CSLn(B) of bank B, and enables the column selection lines of a bank selected from both of the banks A and B in response to address decoding signals, i.e., a plurality of first predecoding signals PDCA23, PDCA45, and PDCA67, bank selection signals, i.e., a plurality of second predecoding signals PADCA01 and PBDCA01, and a reset pulse CSLRSP. In addition, each of the column selection lines CSL0(A), CSL1(A), . . . , CSLn(A) of bank A and the column selection lines CSL0(B), CSL1(B), . . . , CSLn(B) of bank B is connected to eight switching transistors 33 at both sides of the unit memory cell arrays 32. Thus, the two column selection lines each of which being necessary for selecting a column in the conventional semiconductor memory device having a multibank shown in FIG. 1 are used for selecting columns of the banks A and B, respectively. That is, the column selection lines CSL0(A), CSL1(A), . . . , CSLn(A) of bank A are connected to switching lines which connect input and output lines I/O to bit lines of bank A, and the column selection lines CSL0(B), CSL1(B), . . . , CSLn(B) of bank B are connected to switching lines which connect input and output lines I/O to bit lines of bank B. The connection between the column selection lines and the switching lines will be described in detail referring to FIG. 4.

In particular, to alternately arrange a column decoder for each bank in the single column decoder 35 and alternately output the column selection line of each bank, the plurality of second predecoding signals PADCA01 and PBDCA01 including bank information are used as inputs to the column decoder 35. Therefore, the semiconductor memory device having a multibank according to the present invention is provided with first and second column predecoders 43 and 45 respectively, a column address buffer 47, a bank selection bit buffer 49, first and second delays 51 and 53 respectively, and a clock buffer 55, in order to activate the column decoder 35. The second column predecoder 45 in FIG. 3 generates signal PADCA01 for selecting A-Bank and signal PBDCA01 for selecting B-Bank in response to signals PBS0, PBS1 because the memory cell array 31 includes 2 banks, A-Bank and B-Bank (refer to FIG. 6). On the other hand, the second column predecoder 15 in FIG. 1 generates signal DCA01 for selecting A-Bank because the memory cell array 1 includes only one bank, A-Bank. The first column predecoder 13 in FIG. 1 is independent of the signals PBS0, PBS1.

Figure 6:
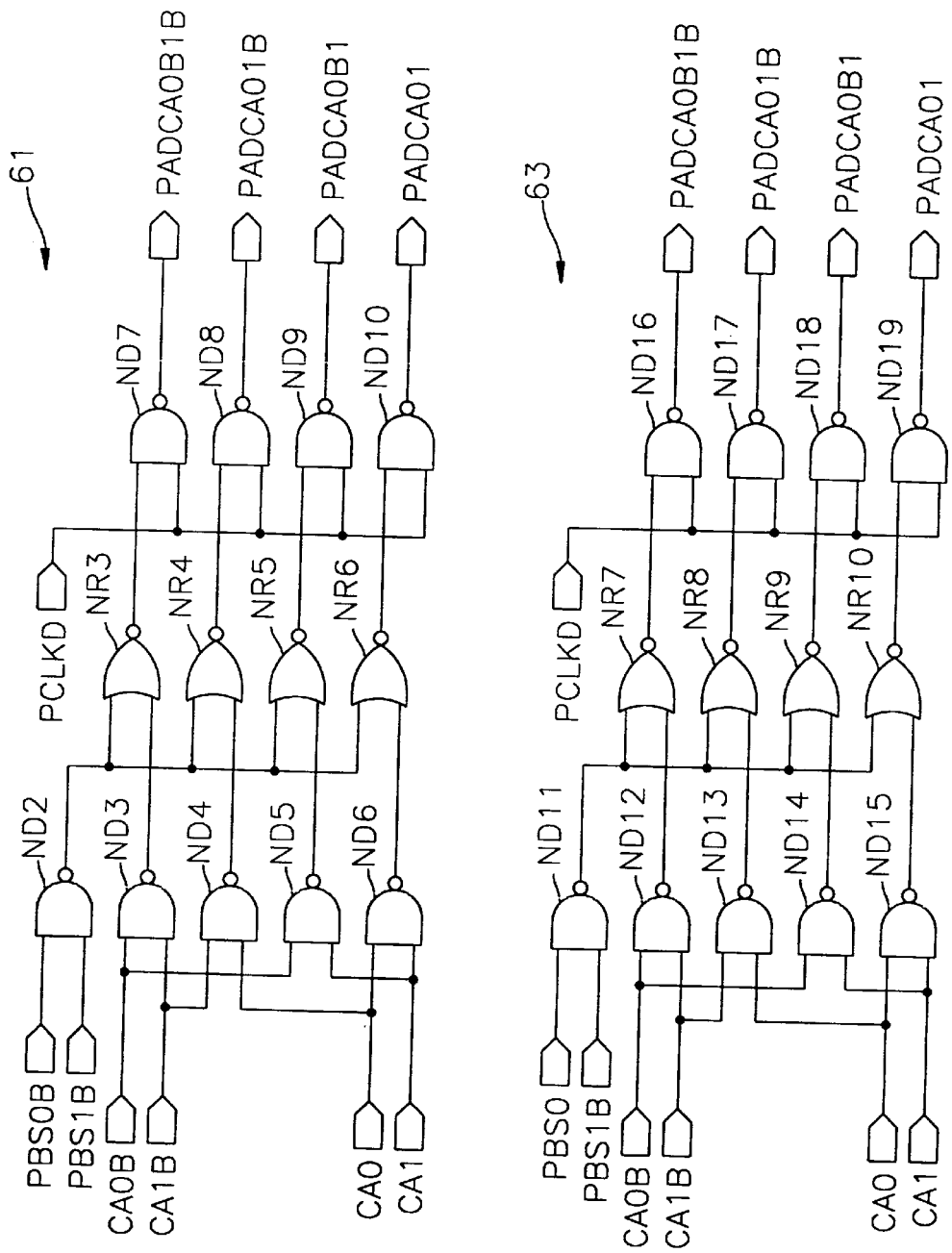
FIG. 6 is a circuit diagram of the second column predecoder in the semiconductor memory device having the multibank shown in FIG. 3.

Signals PADCA0B1B, PADCA01B, PADCA0B1, PBDCA0B1B, PBDCA01B, and PBDCA0B1 in FIG. 6 correspond to other memory cell arrays not shown in FIG. 3.

The column address buffer 47 buffers externally input column address bits A0~A7, and the bank selection bit buffer 49 buffers externally input bank selection bits BS0 and BS1. The first column predecoder 43 decodes CA2~CA7 which are some of the output signals of the column address buffer 47 and generates a plurality of first predecoding signals PDCA23, PDCA45, and PDCA67. The second column predecoder 45 decodes CA0 and CA1 which are others of the output signals of the column address buffer 47 in response to output signals PBS0 and PBS1 and a delayed internal clock signal PCLKD. The clock buffer 55 buffers an externally input clock signal CLK and generates an internal clock signal PCLK. The first and second delays 51 and 53 each delay the internal clock signal PCLK, and generate the delayed clock signal PCLKD and the reset pulse CSLRSP, respectively.

As described above, in the semiconductor memory device having a multibank according to the present invention, since the column decoder of each bank is alternately arranged in the single column decoder 35 without adding a column decoder area for each bank so that the column selection lines of each bank are alternately output, a single large memory cell array can be divided into a plurality of banks without an increase in chip size or power consumption.

Figure 4:
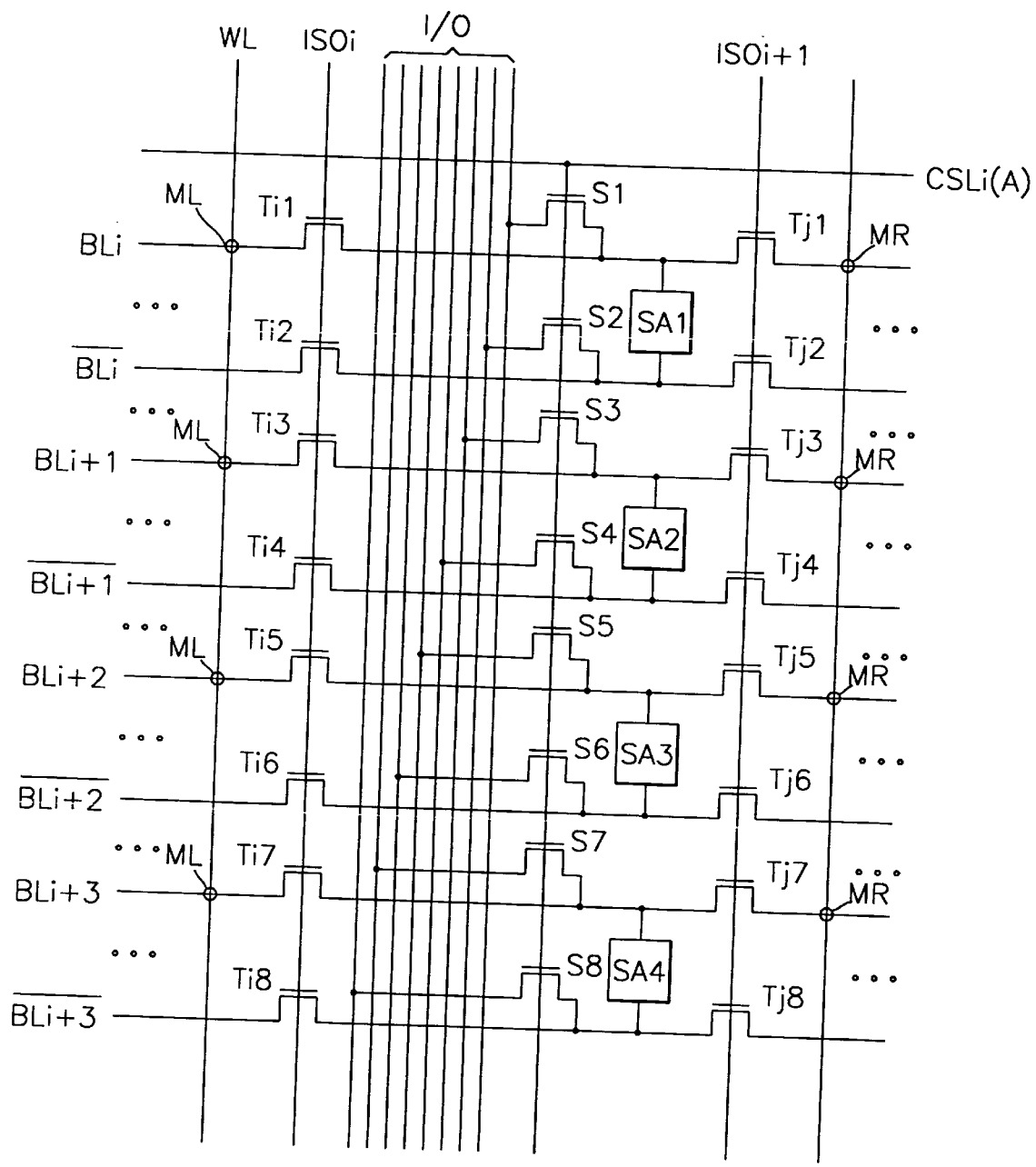
FIG. 4 is a circuit diagram showing the connections between the column selection lines and the switching transistors in the semiconductor memory device having the multibank shown in FIG. 3.

FIG. 4 is a circuit diagram showing the connections between the column selection lines and the switching transistors in the semiconductor memory device having the multibank shown in FIG. 3.

Referring to FIG. 4, a column selection line CSLi(A) or CSLi(B) is connected to each gate of eight switching transistors S1, S2, S3, S4, S5, S6, S7, and S8 which connect eight input and output lines I/O to four pairs of bit lines and complementary bit lines BLi, BLi BLi+1, BLi+1, BLi+2, BLi+2, BLi+3, and BLi+3.

In addition, sense amplifiers SA1, SA2, SA3, and SA4 are connected between the bit lines and the complementary bit lines which are given in pairs. Isolation gates $T_{i1}-T_{i8}$ is are connected between the bit lines and complementary bit lines of a unit memory cell array at the left side, including memory cells ML, and the sense amplifiers SA1, SA2, SA3, and SA4. Isolation gates $T_{j1}-T_{j8}$ are connected between the bit lines and complementary bit lines of a unit memory cell array at the right side, including memory cells MR, and the sense amplifiers SA1, SA2, SA3, and SA4.

Figure 5:
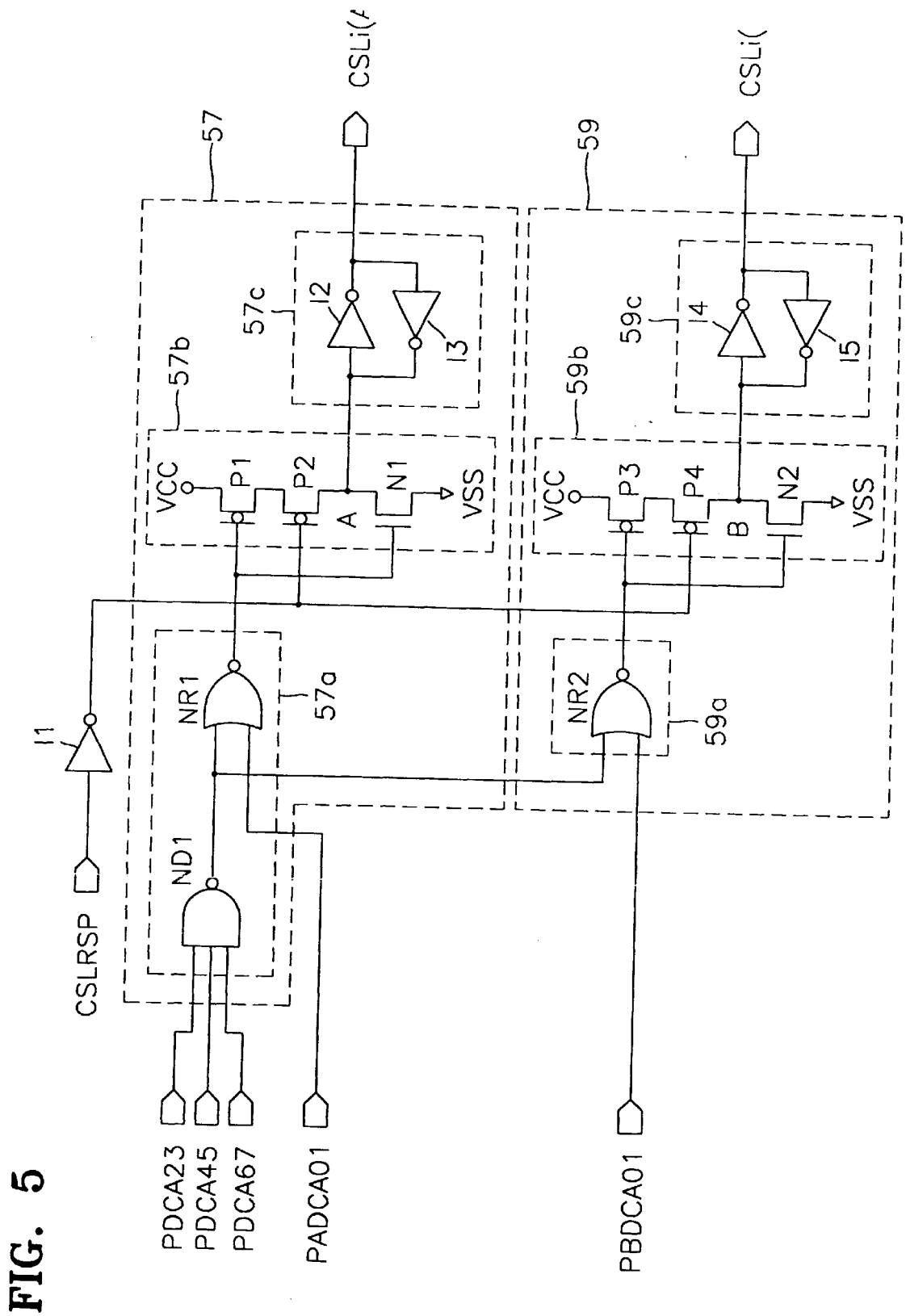
FIG. 5 is a circuit diagram of the column decoder in the semiconductor memory device shown in FIG. 3.

FIG. 5 is a circuit diagram of a column decoder in the semiconductor memory device having the multibank shown in FIG. 3.

Referring to FIG. 5, the single column decoder 35 of this invention includes a bank column decoder 57 for enabling the column selection lines CSLi(A) (I=0,1, . . . ,n) of bank A, and a bank column decoder 59 for enabling the column selection lines CSLi(B) (I=0,1, . . . ,n) of bank B. The bank column decoder 57 enables the column selection lines CSLi(A) of bank A in response to the first predecoding signals PDCA23, PDCA45, and PDCA67, the second predecoding signal PADCA01, and the reset pulse CSLRSP. The bank column decoder 59 enables the column selection lines CSLi(B) of bank B in response to the first predecoding signals PDCA23, PDCA45, and PDCA67, and the other second predecoding signal PBDCA01, and the reset pulse CSLRSP.

The bank column decoder 57 is provided with a logic element 57a for AND-operating the inversion of the second predecoding signal PADCA01 with the result of AND-operating the first predecoding signals PDCA23, PDCA45, and PDCA67, an inverting element 57b for inverting an output signal of the logic element 57a in response to a signal obtained by inverting the reset pulse CSLRSP in an inverter I1, and a latch element 57c for latching an output signal of the inverting means 57b and outputting the latched signal to the column selection lines CSLi(A) of bank A.

Here, the logic element 57a includes, for example, a NAND gate ND1 for NAND-operating the received first predecoding signals PDCA23, PDCA45, and PDCA67, and a NOR gate NR1 for NOR-operating the received second predecoding signal PADCA01. The inverting means 57b includes a first PMOS transistor P1 having a source to which a power voltage VCC is applied, and a gate to which the output signal of the logic element 57a is applied, a second PMOS transistor P2 having a source connected to a drain of the first PMOS transistor P1, a gate to which the inverted signals of the reset pulse CSLRSP is applied, and a drain connected to an output node A, and an NMOS transistor N1 having a drain connected to the output node A, a gate to which the output signal of the logic means 57a is applied, and a source to which a ground voltage VSS is applied. The latch element 57c includes, for example, a first inverter I2 having an input node connected to the output node A of the inverting means 57b, and an output node connected to the column selection lines CSLi(A) of bank A, and a second inverter 13 having an input node connected to the output node of the first inverter 12 and an output node connected to the input node of the first inverter 12.

The bank column decoder 59 is provided with a logic element 59a for AND-operating the inversion of the second predecoding signal PBDCA01 with the result of AND-operating the first predecoding signals PDCA23, PDCA45, and PDCA67, an inverting means 59b for inverting an output signal of the logic element 59a in response to a signal obtained by inverting the reset pulse CSLRSP in the inverter I1, and a latch element 59c for latching an output signal of the inverting element 59b and outputting the latched signal to the column selection lines CSLi(B) of bank B. Here, the logic element 59a includes, for example, a NOR gate NR2 for NOR-operating the received output signal of the NAND gate ND1 with the second predecoding signal PBDCA01. The inverting element 59b includes, for example, a first PMOS transistor P3 having a source to which the power voltage VCC is applied, and a gate to which the output signal of the logic element 59a is applied, a second PMOS transistor P4 having a source connected to a drain of the first PMOS transistor P3, a gate to which the inverted signal of the reset pulse CSLRSP is applied, and a drain connected to an output node B, and an NMOS transistor N2 having a drain connected to the output node B, a gate to which the output signal of the logic element 59a is applied, and a source to which the ground voltage VSS is applied. The latch element 59c includes, for example, a first inverter I4 having an input node connected to the output node B of the inverting element 59b and an output node connected to the column selection lines CSLi(B) of bank B, and a second inverter I5 having an input node connected to the output node of the first inverter 14 and an output node connected to the input node of the first inverter 14. The logic element 57a and 59a, the inverting element 57b and 59b, and the latch element 57c and 59c may have different logic gates.

FIG. 6 is a circuit diagram of a second column decoder in the semiconductor memory device having the multibank shown in FIG. 3.

Referring to FIG. 6, the second column predecoder includes a column predecoder 61 for selecting bank A and a column predecoder 63 for selecting bank B. The column predecoder 61 decodes CA0 and CA1 and their inversions CA0B and CA1B respectively, which are some of the output signals of the column address buffer 47 shown in FIG. 3, in response to the inverted signals PBS0B and PBS1B respectively of the output signals PBS0 and PBS1 respectively of the bank selection bit buffer 49 shown in FIG. 3, and generates four second predecoding signals PADCA0B1B, PADCA01B, PADCA0B1, and PADCA01 for selecting the bank A. The column predecoder 63 decodes CA0, CA1, CA0B and CA1B in response to PBS0 and PBS1B and the delayed internal clock signal PCLKD, and generates four second predecoding signals PBDCA0B1B, PBDCA0B1, and PBDCA01 for selecting bank B. The second predecoding signals are used as input of the column decoder 35 of FIG. 3.

Here, the column predecoder 61 is provided with a NAND gate ND2 for NAND-operating received PBS0B and PBS1B, NAND gates ND3, ND4, ND5, and ND6 for NAND-operating received CA0, CA1, an inverted signal CA0B of CA0, and an inverted signal CA1B of CA1, NOR gates NR3, NR4, NR5, and NR6 for NOR-operating received output signals of the NAND gates ND3, ND4, ND5, and ND6, respectively, with output signal of the NAND gate NS2, and NAND gates ND7, ND8, ND9, and ND10 for NAND-operating received output signals of the NOR gates NR3, NR4, NR5 and NR6, respectively, with delayed internal clock signal PCLKD. The column predecoder 63 is constituted by the column predecoder 61, and includes a NAND gate ND11 for NAND-operating received PBS0 and PBS1B, NAND gates ND12, ND13, ND14, and ND15 for NAND-operating received CA0, CA1, the inverted signal CA0B of CA0, and the inverted signal CA1B of CA1, NOR gates NR7, NR8, NR9, and NR10 for NOR-operating received output signals of the NAND gates ND12, ND13, ND14, and ND15, respectively, with output signal of the NAND gate ND11, and NAND gates ND16, ND17, ND18, and ND19 for NAND-operating received output signals of the NOR gates NR7, NR8, NR9, and NR10, respectively, with delayed internal signal PLCKD. The column predecoders 61 and 63 may have different logic gates when necessary.

Figure 7:
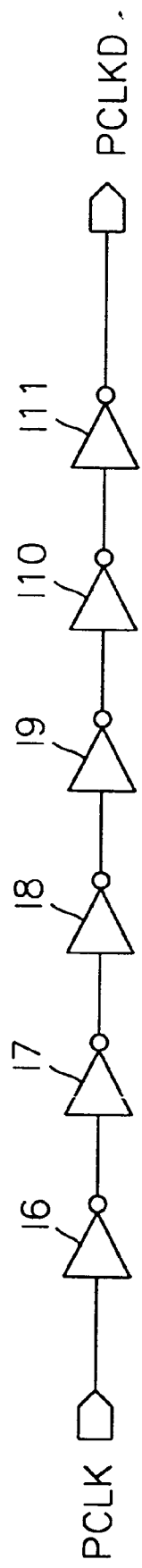
FIG. 7 is a circuit diagram of the first delay in the semiconductor memory device having the multibank shown in FIG. 3.

FIG. 7 is a circuit diagram of a first delay in the semiconductor memory device having the multibank shown in FIG. 3.

Referring to FIG. 7, the first delay, constituted by a chain of six inverters I6~I11 connected in series, delays the received internal clock signal PCLK for a predetermined time, and outputs the delayed internal clock signal PCLKD. The number of inverters can be varied when necessary, and the first delay may have different logic gates.

Figure 8:
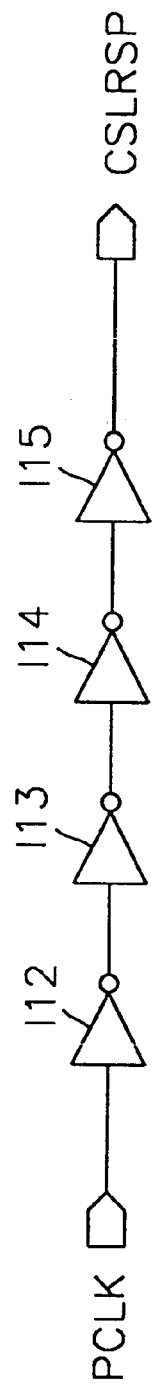
FIG. 8 is a circuit diagram of the second delay in the semiconductor memory device shown in FIG. 3.

FIG. 8 is a circuit diagram of a second delay in the semiconductor memory device having the multibank shown in FIG. 3.

Referring to FIG. 8, the second delay, constituted by a chain of four inverters I12~I15, delays the received internal clock signal PCLK for a predetermined time and outputs the reset pulse CSLRSP. The number of inverters can be varied when necessary, and the second delay may have different logic gates.

Figure 9:
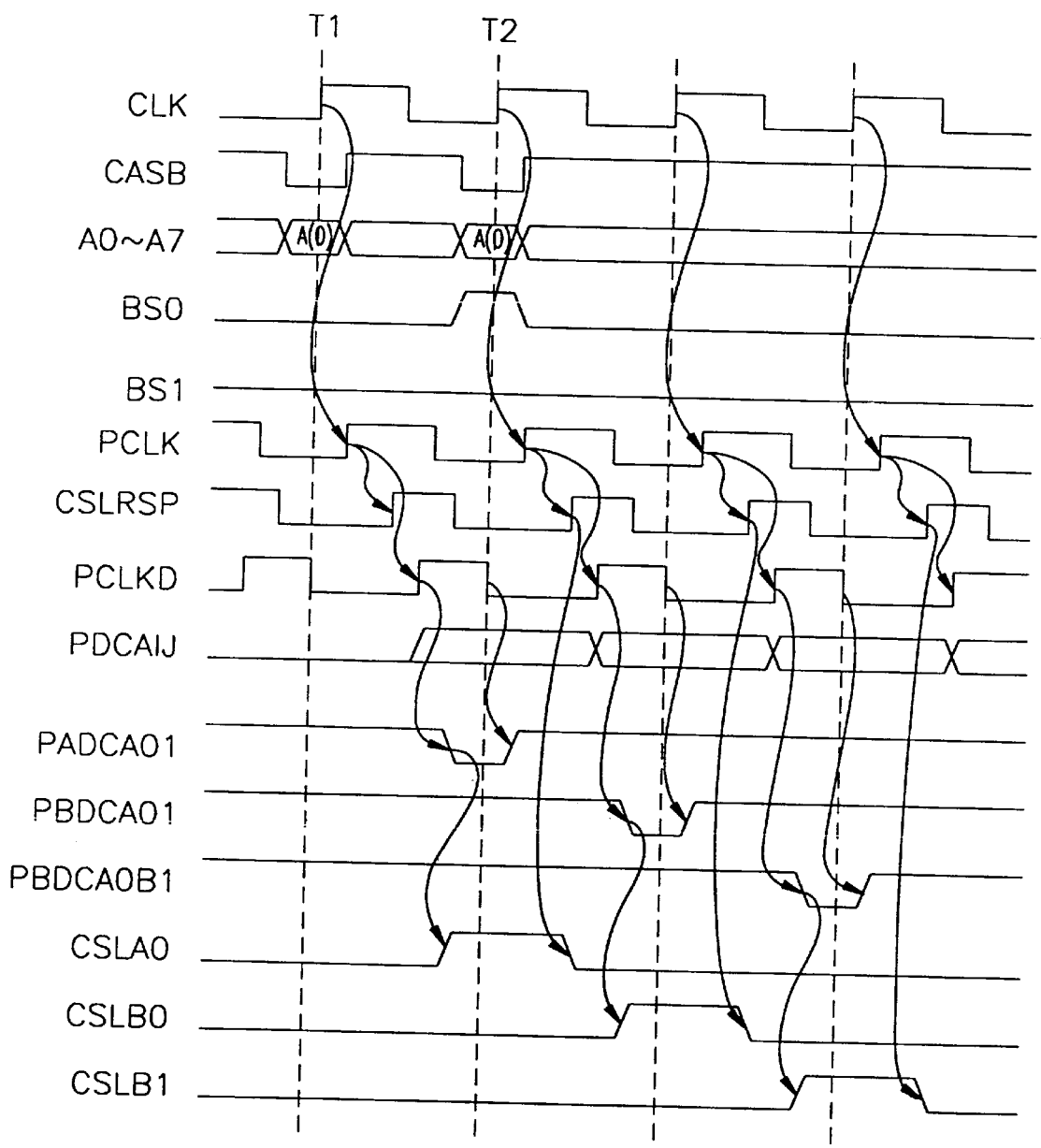
FIG. 9 is an operation timing diagram of the semiconductor memory device having the multibank shown in FIG. 3 according to the present invention.

FIG. 9 is an operation timing diagram of the semiconductor memory device having the multibank shown in FIG. 3.

When the clock signal CLK, a column address strobe signal CASB, and address bits A0–A7 are externally input, and the bank selection bits BS0 and BS1 are all externally input at a low level, to the semiconductor memory device of FIG. 3, as at point T1, a read operation for bank A starts. Thus, the clock buffer 55 delays the clock signal CLK and generates the internal clock signal PCLK, and the first and second delays 51 and 53 delay the internal clock signals PCLK and generates the delayed internal clock signal PLCKD and reset pulse CSLRSP, respectively. Here, the first column predecoder 43 decodes signals CA2~CA7 obtained from the address bits A2~A7 input to the column address buffer 47. In addition, here, since the bank selection bits BS0 and BS1 are all logic low, the output signals PBS0 and PBS1 of the bank selection bit buffer 49 becomes a logic low. Thus, a column predecoder for selecting bank A operates in the second column predecoder 45. That is, referring to the circuit diagram of the second column predecoder 45 shown in FIG. 6, since both PBS0 and PBS1 are logic low, and their inverted signals PBS0B and PBS1B are logic high, the four second predecoding signals PBDCA0BLB, PBDCA01B, PBDCA0B1, and PBDCA01 being the output signals for selecting bank B of the column predecoder 63 are all disabled to a logic high level. In addition, one of the four second predecoding signals PADCA0B1B, PADCA01B, PADCA0B1, and PADCA01 being the output signals, for selecting bank A, of the column predecoder 61, is enabled to a logic low level, and the others are disabled to a logic high level in response to the signals CA0 and CA1 obtained from the address bits A0 and A1 input to the column address buffer 47. For example, the second predecoding signal PADCA01 input to the column decoder 35 in the semiconductor memory device of FIG. 3 is enabled to a low level at a rising edge of the delayed internal clock signal PCLKD and disabled to a high level at a falling edge thereof when both CA0 and CA1 are logic high. Thus, the column selection line CSLA0 of bank A is enabled to logic high when the second predecoding signal PADCA01 is enabled to logic low, and disabled to logic low at a rising edge of the reset pulse CSLRSP.

As at point T2, when the bank selection bits BS0 and BS1 are input at logic high and low levels, respectively, a read operation for bank B starts. Here, the first column predecoder 43 decodes the signals CA2~CA7 obtained from the address bits A2~A7 input to the column address buffer 47 and generates a first predecoding signal PDCAij. In addition, here, since the bank selection bits BS0 and BS1 are logic high and low, respectively, the output signals PBS0 and PBS1 of the bank selection bit buffer 49 become logic high and low, respectively. Thus, the column decoder for selecting bank B operates in the second column predecoder 45. That is, referring to the circuit diagram of the second column predecoder 45 shown in FIG. 6, since PBS0 and PBS1 are logic high and low, respectively, their inverted signals PBS0B and PBS1B are logic low and high, respectively. Thus, the four second predecoding signals PADCA0B1B, PADCA01B, PADCA0B1, and PADCA01 being output signals of the column predecoder 61 for selecting bank A are all disabled to logic high. One of the four second predecoding signals PBDCA0B1B, PBDCA01B, PBDCA0B1, and PBDCA01 being output signals of the column predecoder 61 for selecting bank B is enabled to logic low in response to CA0 and CA1, and the others are disabled to logic high. The above operation is repeated whenever CA0 and CA1 vary. The second predecoding signals PBDCA0B1B, PBDCA01B, PBDCA0B1, and PBDCA01 are enabled to low at a rising edge of the delayed internal clock signal PCLKD and disabled to high at a falling edge thereof, respectively. Only PBDCA0B1 and PBDCA01 are shown as example in the operation timing diagram of FIG. 9. Thus, the column selection lines CSLB0 and CSLB1 of bank B are enabled to logic high when the second predecoding signals PBDCA01 and PBDCA0B1 are enabled to logic low, respectively, and disabled at a rising edge of the reset pulse CSLRSP.

Figure 10A:
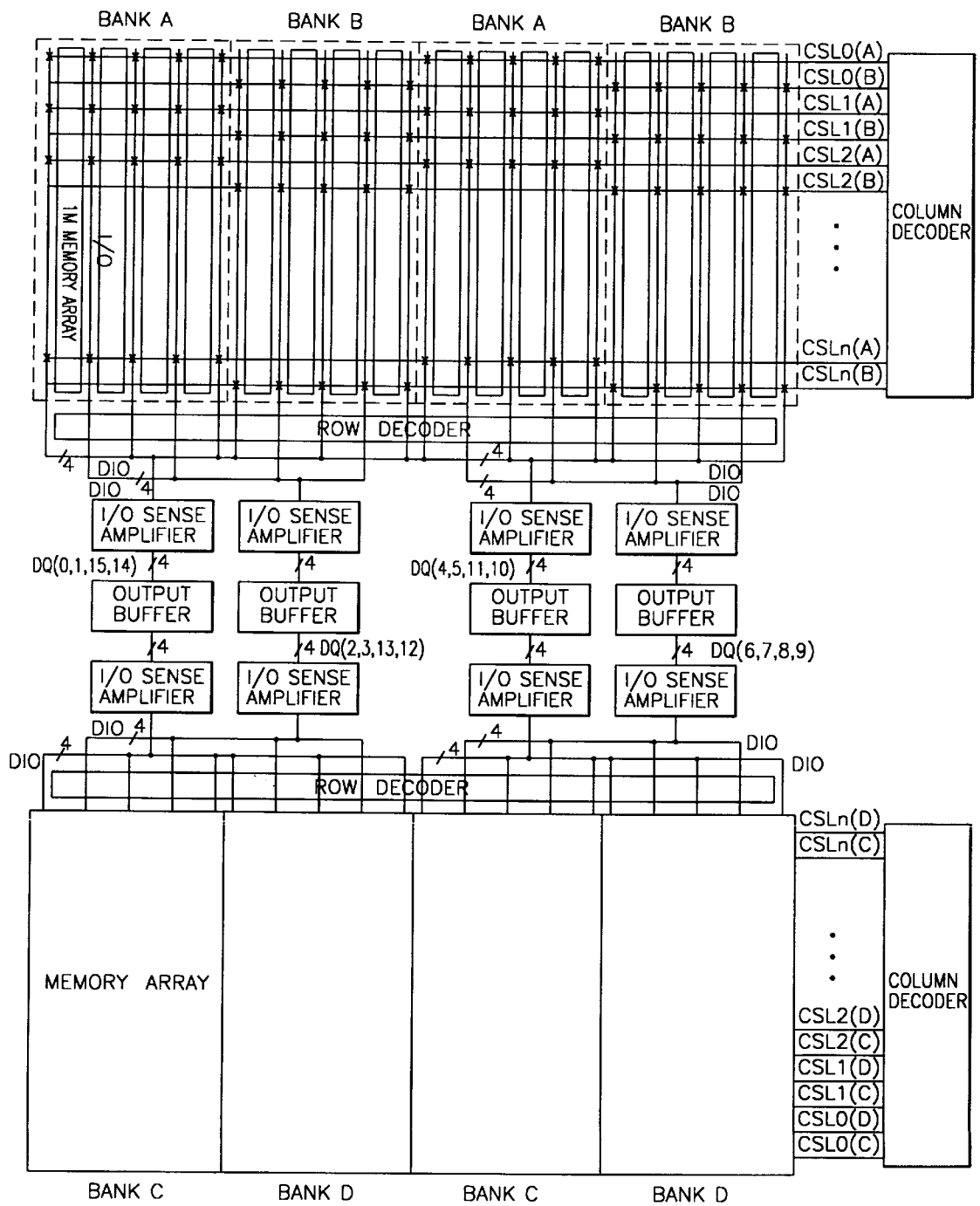
FIG. 10 is a block diagram of a 4-bank DRAM to which the present invention is applied.
Figure 10B:
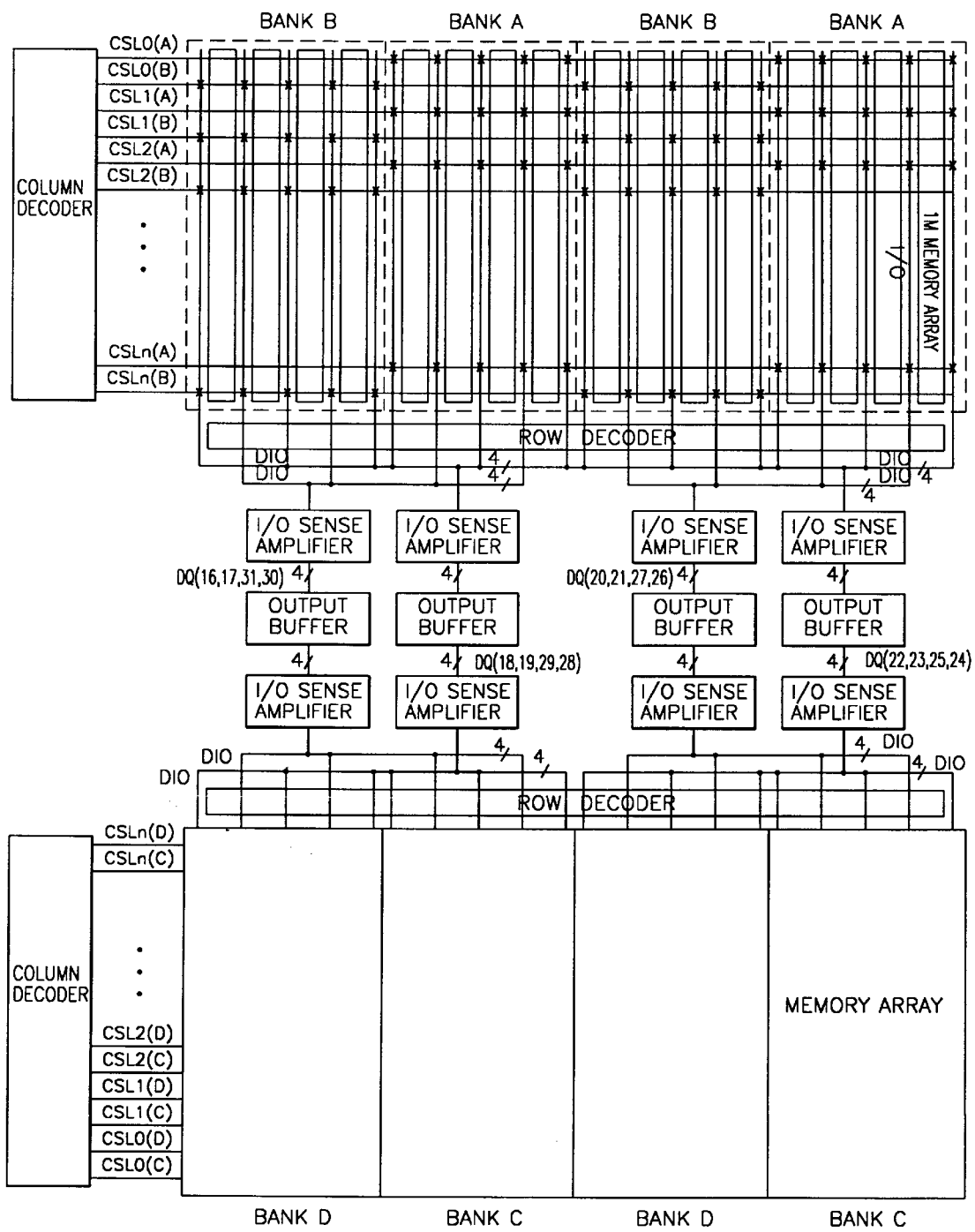

FIG. 10 is a block diagram of an exemplary 4-bank synchronous DRAM to which the present invention is applied. Also, a memory cell array 31, as shown in FIG. 3, may include more than two banks depending upon the configuration of the column decoder 35 and first/second column decoders 43/45. If an array included three banks, they could be arrayed in the order A, B & C and A, B, C, being either asymmetrically or symmetrically arranged.

In conclusion, the semiconductor memory device having a multibank according to the present invention is constituted so that the column decoder for each bank is alternately arranged in a single column decoder without adding a column decoder area to each bank in order to alternately output the column selection signals to the bank. Therefore, a single large memory cell array can be divided into a plurality of banks without increasing the chip size or power consumption.

As described above, though the present invention has been described with an embodiment illustrated in the drawings, it is a mere exemplary application. Thus, the present invention is not limited to the above embodiment, and it is clearly understood that many variations are possible within the scope and spirit of the present invention by anyone skilled in the art.

What is claimed is:

1. A semiconductor memory device having a multibank comprising:

a memory cell array divided into a plurality of banks, the plurality of banks being alternately arranged, and having a plurality of unit memory cell arrays;

a column decoder having a plurality of output ports arranged so that the output ports are alternately connected to the column selection lines of one of the banks, for enabling the column selection lines of one of the banks in response to address decoding signals and bank selection signals;

a column address buffer for buffering an externally input column address;

a bank selection bit buffer for buffering externally input bank selection bits;

a first column predecoder for decoding some of the output signals of the column address buffer and generating the address decoding signals;

a second column predecoder for decoding the remaining output signals of the column address buffer in response to output signals of the bank selection bit buffer and a delayed internal clock signal and generating the bank selection signals;

a clock buffer for buffering an externally input clock signal and generating an internal clock signal; and first and second delays for delaying the internal clock signal and generating the delayed clock signal and reset pulse, respectively.

2. A semiconductor memory device having a multibank comprising:

a memory cell array divided into a plurality of banks, the plurality of banks being alternately arranged, and having a plurality of unit memory cell arrays; and a column decoder having a plurality of output ports arranged so that the output ports are alternately connected to the column selection lines of one of the banks, for enabling the column selection lines of one of the banks in response to address decoding signals and bank selection signals, wherein the column decoder comprises a plurality of bank column decoders for enabling the column selection lines of each bank, wherein each bank column decoder enables the column selection lines of the bank in response to the address decoding signals and one of the bank selection signals.

3. The device of claim 2, wherein the bank column decoder comprises:

logic means for AND-operating the address decoding signals with the inversion of one of the bank selection signals;

means for inverting an output signal of the logic means in response to an inverted signal of the reset pulse; and latch means for latching an output signal of the inverting means and outputting the latched signal to the column selection line.

4. The device of claim 3, wherein the logic means comprises:

a NAND gate for receiving the address decoding signals and NAND-operating the received signals; and a NOR gate for receiving one of the bank selection signals and the output of the NAND gate and NOR-operating the received signals.

5. The device of claim 4, wherein the inverting means comprises:

a first PMOS transistor having a source to which a power voltage is applied, and a gate to which the output signal of the logic means is applied;

a second PMOS transistor having a source connected to a drain of the first PMOS transistor, a gate to which the inverted signal of the reset pulse is applied, and a drain connected to an output node for outputting the output signal; and an NMOS transistor having a drain connected to the output node, a gate to which the output signal of the logic means is applied, and a source to which a ground voltage is applied.

6. The device of claim 4, wherein the latch means comprises:

a first inverter having an input node connected to the output node of the inverting means and an output node connected to the column selection line; and a second inverter having an input node connected to the output node of the first inverter and an output node connected to the input node of the first inverter.

* * * * *

UNITED STATES PATENT AND TRADEMARK OFFICE
CERTIFICATE OF CORRECTION

PATENT NO.   : 6,026,045
DATED        : February 15, 2000
INVENTOR(S)  : Son

It is certified that error appears in the above-identified patent and that said Letters Patent is hereby corrected as shown below:

Column 2,
Line 55, "CSL0(A)~SLn(A)" should read -- CSL0(A)~CSLn(A) --.

Column 5,
Line 62, "BLi, BLi BLi+1," should read -- BLi, BLi, BLi+1, --.
Line 66, "Ti1 –Ti8 is are" should read -- Ti1 –Ti8 are --.

Column 6,
Line 54, "inverter 13" should read -- inverter I3 --.
Line 55, "inverter 12" should read -- inverter I2 --.

Column 7,
Lines 19 and 20, "14" should read -- I4 --.
Line 40, "PBDCA0B1B, PBDCA0B1," should read -- PBDCA0B1B, PBDCA01B, PBDCA0B1, --.
Line 67, "PLCKD" should read -- PCLKD --.

Column 8,
Line 34, "PLCKD" should read -- PCLKD --.
Line 45, "PBDCA0BLB" should read -- PBDCA0B1B --.

Signed and Sealed this

Twelfth Day of November, 2002

Attest:

JAMES E. ROGAN
Attesting Officer     Director of the United States Patent and Trademark Office